United States Patent [19]

Gaskell et al.

[11] Patent Number: 5,079,521
[45] Date of Patent: Jan. 7, 1992

[54] FRACTIONAL-N FREQUENCY SYNTHESIZER USING DELTA-SIGMA MODULATOR IN DIVIDER CONTROL CIRCUIT

[75] Inventors: Philip S. Gaskell, Little Shelford; Nigel J. R. King, South Brent; Eric Breakenridge, Alloa; Michael J. Ball, Bishops Stortford, all of United Kingdom

[73] Assignee: STC plc, London, England

[21] Appl. No.: 616,861

[22] Filed: Nov. 21, 1990

[30] Foreign Application Priority Data

Nov. 22, 1989 [GB] United Kingdom ............... 8926358

[51] Int. Cl.⁵ .................................. H03L 7/197
[52] U.S. Cl. ................................ 331/1 A; 331/16; 331/25; 377/48
[58] Field of Search .............. 331/1 A, 16, 25; 377/48

[56] References Cited

U.S. PATENT DOCUMENTS 4,179,670 12/1979 Kingsbury ........................ 331/10
4,965,531 10/1990 Riley ............................ 331/16 X Primary Examiner—Siegfried H. Grimm
Attorney, Agent, or Firm—Lee, Mann, Smith, McWilliams & Sweeney

[57] ABSTRACT

A fractional-N frequency synthesizer having a programmable divider and a control circuit therefor, wherein said control circuit incorporates a digital delta-sigma modulator operating as an interpolator.

8 Claims, 6 Drawing Sheets $$Y(Z) = \frac{H(Z)}{1+H(Z)} X(Z) + \frac{1}{1+H(Z)} E(Z)$$

$$Y(Z) = E(Z) \cdot (1-Z^{-1})^2 + X(Z) \cdot Z^{-1}$$

FRACTIONAL-N FREQUENCY SYNTHESIZER USING DELTA-SIGMA MODULATOR IN DIVIDER CONTROL CIRCUIT

FIELD OF THE INVENTION

This invention relates to frequency synthesisers of the type in which a phase locked loop incorporates a programmable multi-modulus frequency divider the control input of which is switched between two or more integer values determined by a digital control circuit.

DESCRIPTION OF RELATED ART

The output frequency of a phase-locked loop frequency synthesiser depends on the reference frequency and the division ratio:

$$f_{out} = N \cdot f_{ref}$$

where
N is an integer
$f_{out}$ = output frequency
$f_{ref}$ = reference frequency For fine frequency resolution, N may be increased and $f_{ref}$ reduced but this gives rise to increased phase noise due to the higher division ratio and reduced frequency switching speed because of the lower loop bandwidth. An alternative technique is to switch N between two or more integer levels such that the average value of N is fractional. Such a synthesiser is often referred to as a 'fractional-N synthesiser' and can be considered as a method of interpolating a fractional number from integer values, hence the term 'Interpolating Synthesiser'. The interpolation algorithm is critical to minimising spurious signals and phase noise. Such a synthesiser is disclosed in British patent No. 2026268.

The general architecture of an interpolating synthesiser is shown in FIG. 1. The output frequency from a voltage controlled oscillator (VCO) 10 is divided by a programmable divider 11 and compared with the output of a reference oscillator 12 using a phase detector 13. The output error signal is filtered in a low pass filter 14 and the resultant signal controls the frequency of the VCO. If the control signal N were fixed, this would represent a standard phase-lock loop. In an interpolating synthesiser, the control signal is switched between two or more integer values determined by a digital control circuit. The control circuit may be split into several components. A logic circuit 16 converts an input number F, representing the desired frequency, into an integer number P and a fractional number M. An interpolator circuit 15 converts M into a data stream M' (nT), at the reference frequency clock rate, where M' at any time nT takes one of two or more integer values. The average value of M' (nT) is M. M' is then combined with P to form a data stream, N(nT) at the reference frequency clock rate. In its simplest form the combiner is simply an adder. The average value of N is such that $$f_{out} = F_{ref} \times N(nT)$$

If a poor interpolation algorithm is used, then it may be necessary to correct for interpolation errors by calculating, converting to analogue (via a digital-to-analogue converter) and, adding by means of circuit 17 the error signal to the output of the phase comparator. Depending on the nature of the interpolator, the error signal may need to be differentiated prior to addition to the phase detector output. In some practical systems, generating the error signal accurately is a difficult process because of the required high speeds and high accuracy of the digital-to-analogue converter.

SUMMARY OF THE INVENTION

According to the present invention there is provided a fractional-N frequency synthesiser having a programmable divider and control means therefor, wherein said control means incorporates a digital delta-sigma based modulator operating as an interpolator.

BRIEF DESCRIPTION OF THE DRAWINGS

Embodiments of the invention will now be described with reference to the accompanying drawings in which.

DESCRIPTION OF THE PREFERRED EMBODIMENTS

The form of interpolation utilised in the present invention employs principles similar to those underlying oversampling noise-shaping analogue-to-digital coders (ADC). Such an ADC is disclosed in, for example, British Patent 1 450 989 and are generally referred to as delta-sigma coders or modulators.

These coders or modulators have traditionally been associated with A/D conversion where oversampling and noise-shaping are used to force the error signal due to a coarse conversion stage outside the wanted signal band. This gives a rising noise and distortion profile with frequency. In an interpolating synthesiser, the goal is to ensure that, within the closed loop bandwidth, the noise and spurii from the interpolator are low; at larger offsets, higher levels of noise and spurii from the interpolator are rejected by the low pass filtering action of the loop. Whereas the noise-shaping coder for an ADC is analogue, the modulator for the synthesiser is digital.

The main advantages of this technique for a synthesiser are:
low phase noise
low levels of spurious signals
error correcting digital-to-analogue converter (DAC) may be omitted
wider closed loop bandwidth giving improved frequency agility.

Current fractional-N synthesisers have control circuits consisting of one or more accumulators in series whose respective carry bits are used to control the division ratio of the frequency divider. In the proposed invention the basic control element is a first or second order feedback noise-shaping modulator; higher orders can be realised by the addition of further first- or second- order modulators in a feed-forward arrangement.

Figure 1:
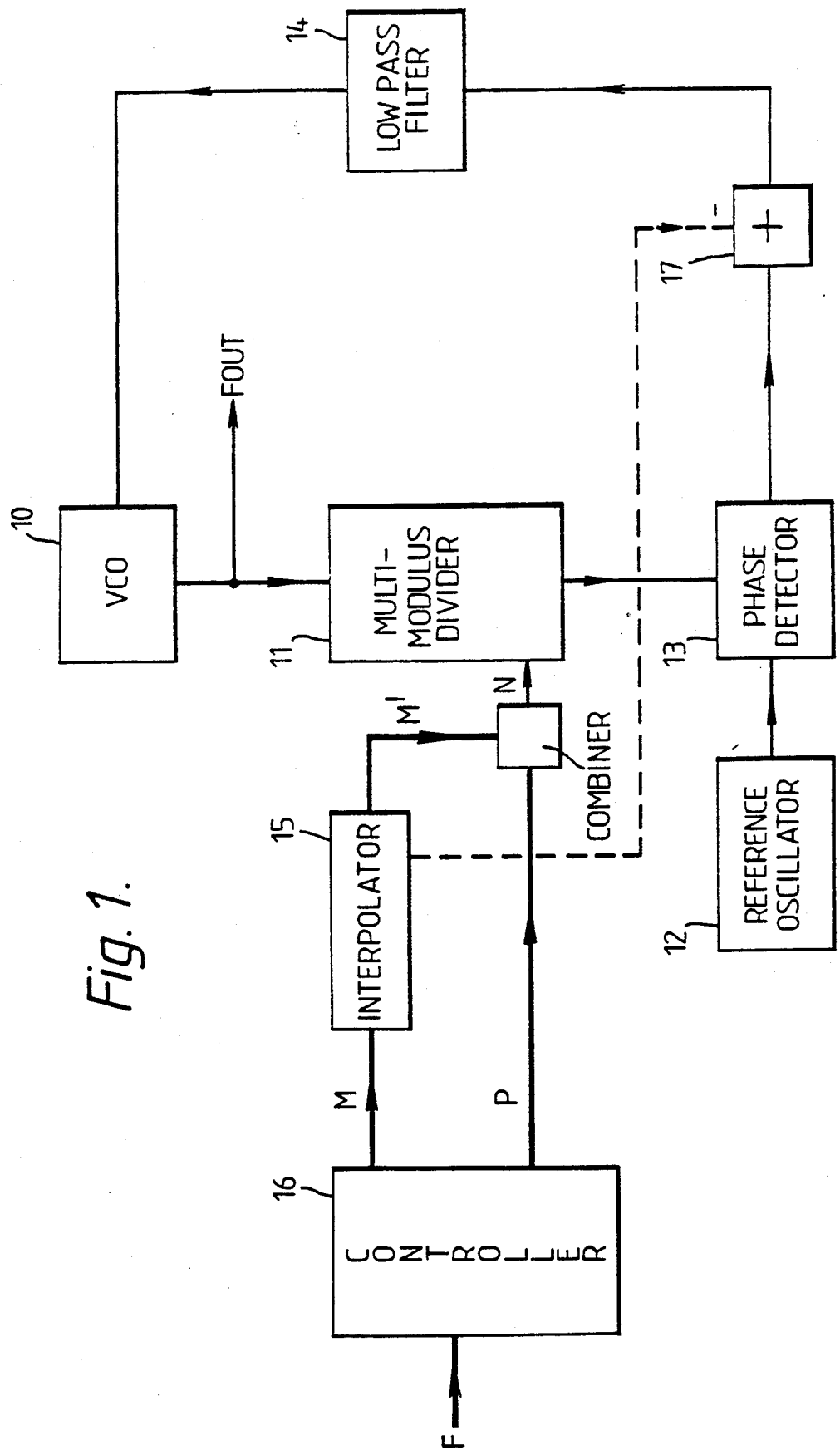
FIG. 1 illustrates in block schematic form the general architecture of a single loop interpolating synthesiser.
Figure 2:
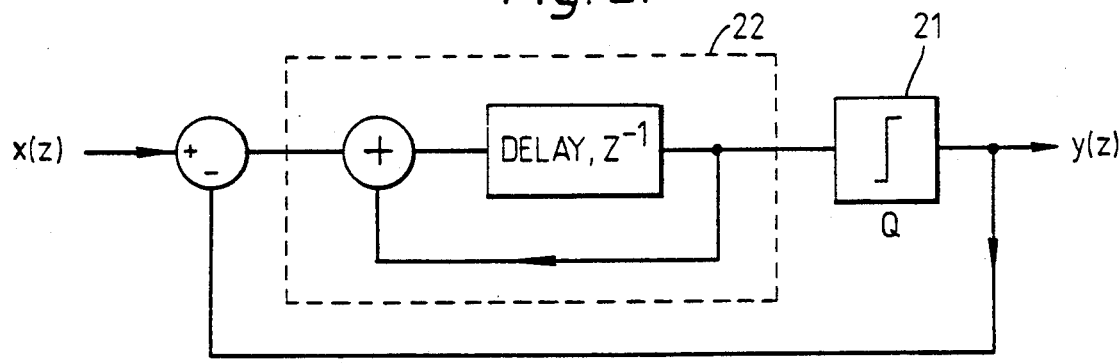
FIG. 2 illustrates a first order interpolator.

The simplest form of the control circuit interpolator is a first order feedback modulator similar in concept to a digital sigma-delta modulator FIG. 2. This consists of a coarse (normally one-bit) quantiser 21 preceded by a first order integrator 22. Negative feedback is applied from the output of the quantiser to the input of the modulator. This circuit is liable to have poor noise rejection and high spurii and the second-order equivalent is in practice more useful.

Figure 3:
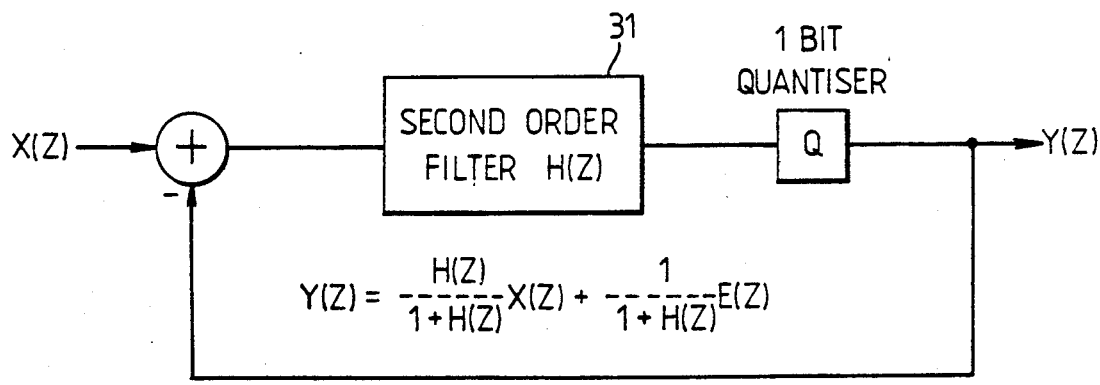
FIG. 3 illustrates a single loop feedback second order interpolator.
Figure 4:
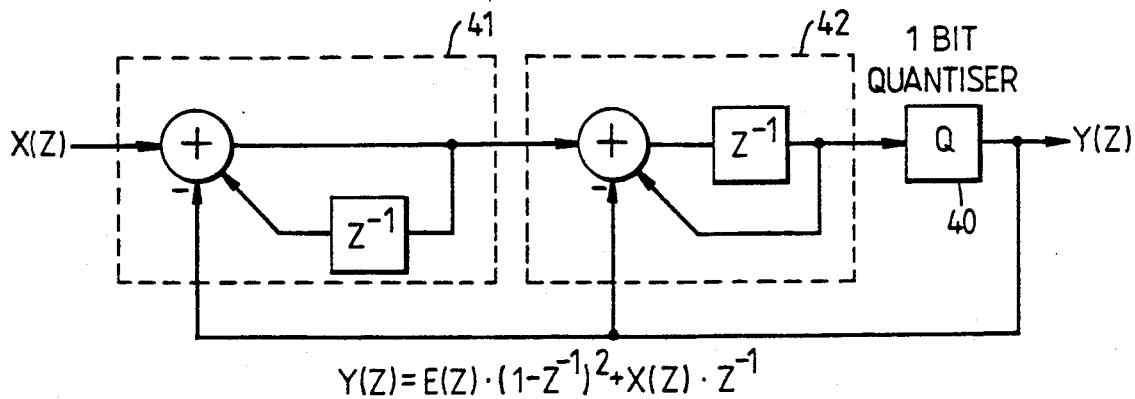
FIG. 4 illustrates a dual loop, feedback second order, interpolator.

The second order modulator can be configured as a single loop with a single second-order filter 31 (FIG. 3) or a double feedback loop with two first order integrators 41, 42 (FIG. 4). There are a number of possible variants of the basic circuit where extra unit delays or additional gain stages are included. Taking the double loop circuit (FIG. 4) as an example, the core of the modulator is a coarse resolution quantiser 40 (usually one-bit but it could be more) preceded by a first-order digital integrator 42. The Q output from the quantiser is fed back to the integrator input to form an inner loop. The inner loop itself is located in an outer loop incorporating another first order integrator 41. The input to the modulator is a multi-bit word with adequate precision to give the final required frequency resolution.

The transfer function is conveniently described in the z-domain:

$$Y(z) = z^{-1}.X(z) + (1-z^{-1})^2.E(\text{i } z) \qquad (1)$$

This shows that the wanted signal has unity gain plus a unit delay, and that the core quantising noise $E(z)$ is shaped by a second order function $(1-z^{-1})^2$. $E(z)$ is the quantisation noise from the modulator, and has an essentially white spectrum.

Figure 5:
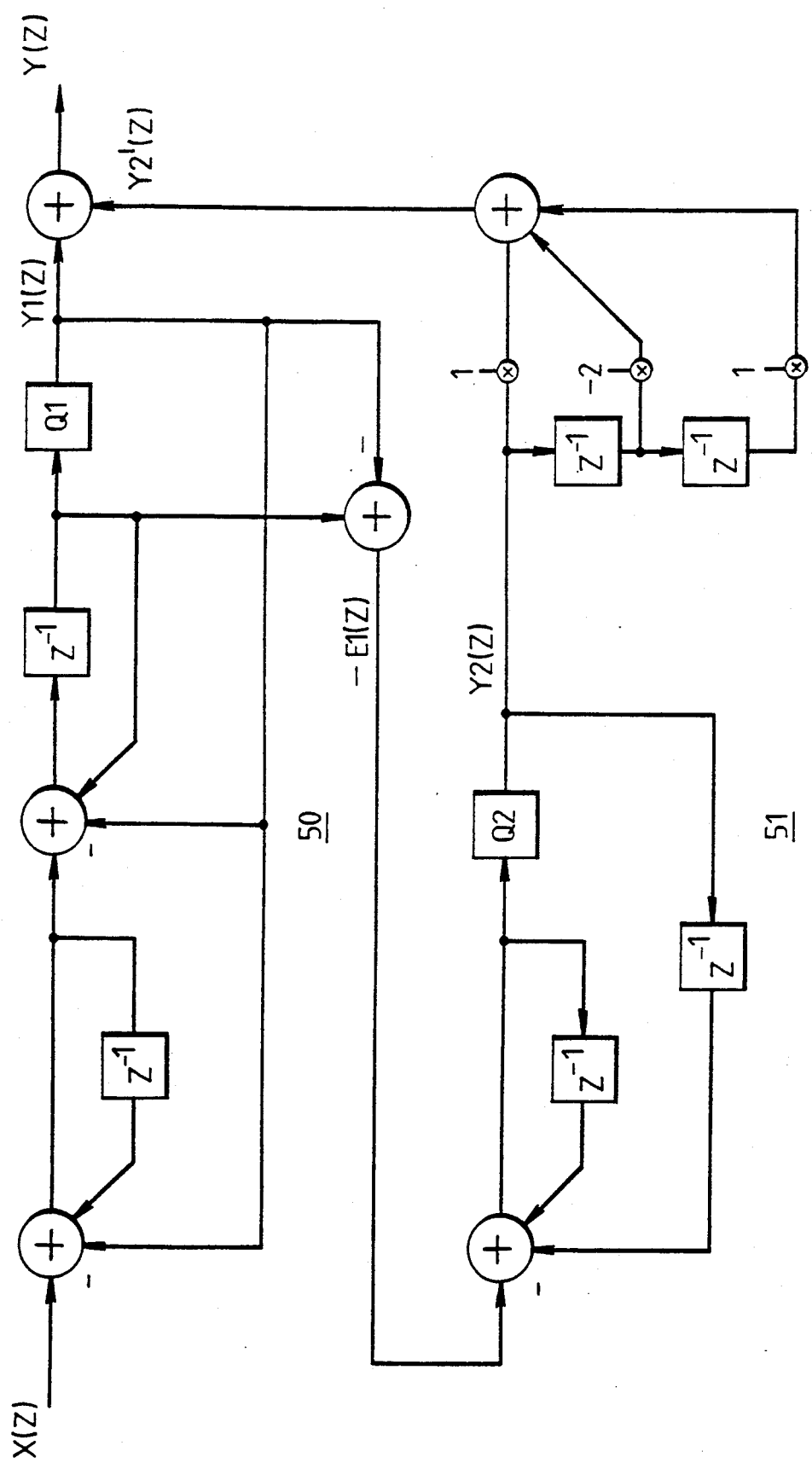
FIG. 5 illustrates a third order interpolator with a first order feed-forward loop.

The noise rejection of the basic second-order circuit can be improved by feeding the quantisation error signal from the first stage 50 forward to a further first or second order stage 51 (see FIG. 5). The output from the second stage is recombined with that of the first stage. Since the error signal fed forward to the second stage is the unweighted (i.e. white) quantisation noise, the output from the second stage has to be weighted in the same manner as in the first stage, before it can be combined with the first stage output.

Again, there are several variants of the basic high order feed-forward circuit. Taking the third order circuit shown in FIG. 5 as an example, the output from the first stage is $$Y_1(z) = z^{-1}.X(z) + (1-z^{-1})^2.E_1(z) \qquad (2)$$

and the error signal fed to the second stage is $-E_1(z)$. The output from the second stage is given by $$Y_2(z) = E_1(z) + (1-z^{-1}).E_2(z) \qquad (3)$$

Since the first stage error signal has a second order frequency weighting, the second stage output must be weighted in line with the first stage output:

$$Y_2(z) = (1-z^{-1})^2.E_1(z) + (1-z^{-1})^3.E_2(z) \qquad (4)$$

After combination with the first stage the final output is:
$$Y(z) = z^{-1}.X(z) + (1-z^{-1})^3.E_2(z) \qquad (5)$$

Since $E(z)$ has an approximately white spectral characteristic, Equation 5 shows that the resultant overall error signal has a third order characteristic and the wanted signal has a flat transfer function. In-band spurii are likewise suppressed by the high loop gain implicit in the third order circuit. The reduced in-band noise and spurii from the interpolator translates to lower close-in phase-noise and spurii from the synthesiser.

When the stage outputs are re-combined, the interpolator produces a multi-bit output which drives a programmable divider in the loop. For the 3rd order circuit, there are six possible output levels and 6-division ratios.

Figure 6:
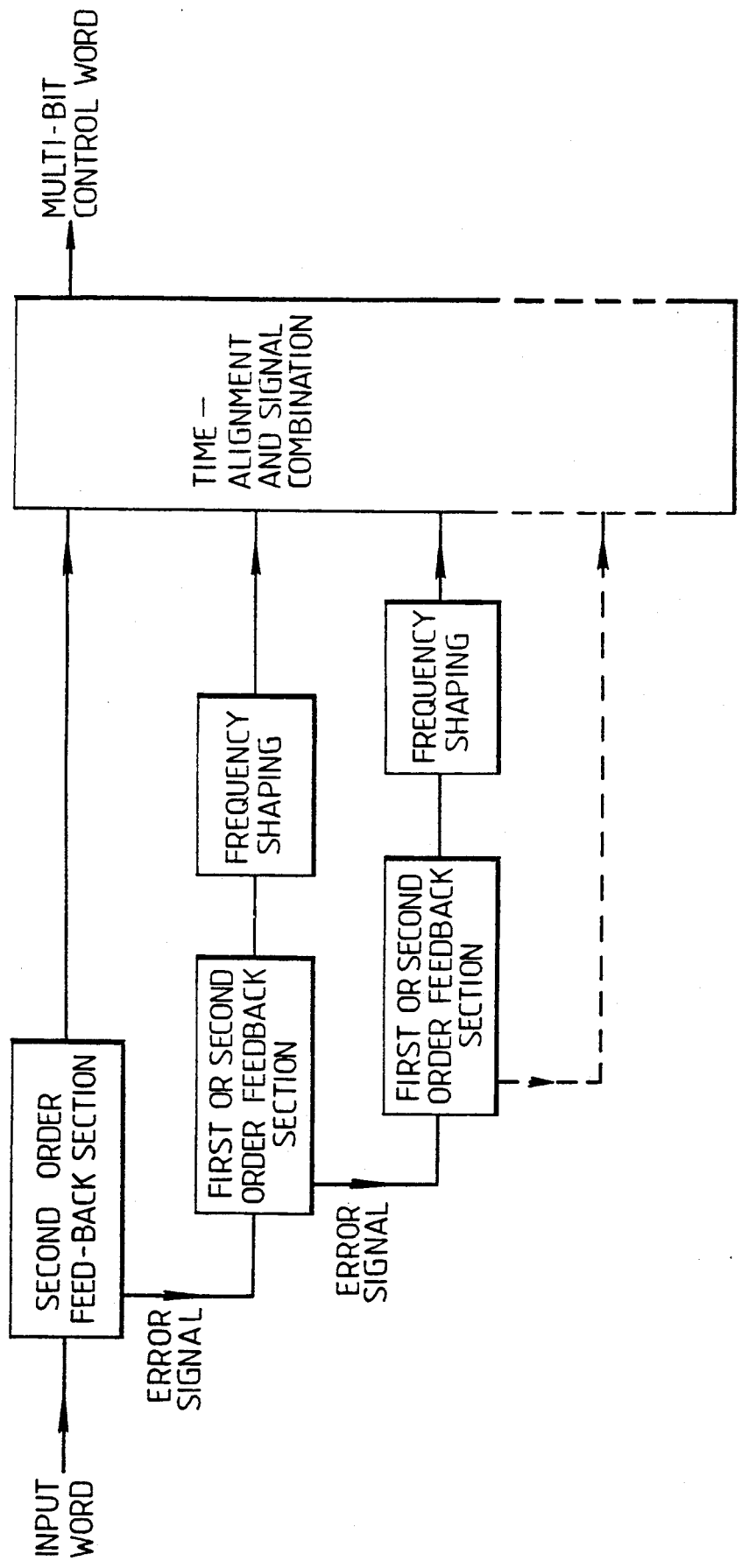
FIG. 6 illustrates a multi-stage interpolator

These same feed-forward principles can be extended to fourth and higher order implementations (see FIG. 6). The second and subsequent stages can be a combination of first or second order stages.

Figure 7:
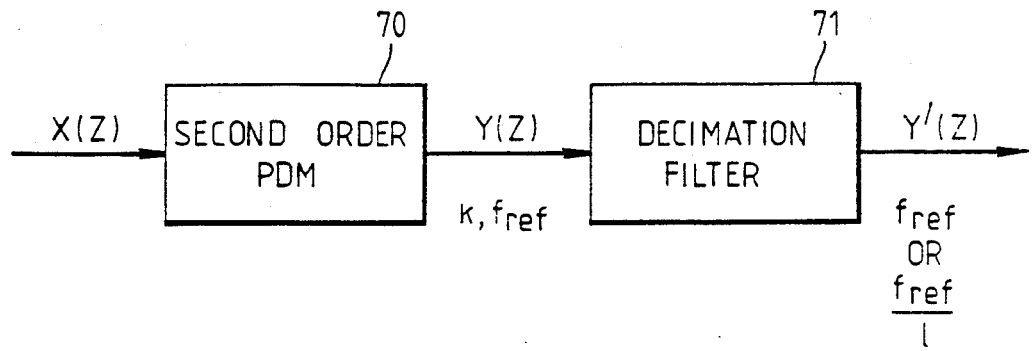
FIG. 7 illustrates an interpolator with a second order delta-sigma modulator and a down sampling decimation filter.

An alternative method of generating the interpolating switching signal is to start with a sampling frequency which is a multiple of the reference frequency (K. $f_{ref}$) and to decimate down to the reference frequency or a sub-multiple of the reference frequency. The basic structure is shown in FIG. 7. As shown in FIG. 7 the output of a second order modulator 70, at frequency (k.$f_{ref}$), is applied to a decimation filter 71 where it is decimated down to either $f_{ref}$ or $f_{ref}/1$.

The basic principle stems from the frequency domain representation of the interpolator noise output function, $(1-z^{-1})^2.E(z)$, given by $$N(f) = \left(1 - \cos\left(2\pi \frac{f}{f_s}\right)\right) \cdot E(f) \qquad (6)$$

$N(f)$ has a null around $f = 0$Hz, the width of which (for a given attenuation) is proportional to the sampling frequency fs. If the initial modulation can be performed at some higher sampling frequency, before re-sampling at the reference frequency in a manner that does not increase the noise, then the increased noise free bandwidth of the initial modulation can be utilised.

The process of re-sampling without increasing the noise is called decimation. The process involves filtering the signal and then down-sampling the filter output. A suitable filter for a second-order modulator is one with the transfer function:

$$H(z) = \frac{(1 - z^{-n})^3}{(1 - z^{-1})} \qquad (7)$$

A filter of this type involves accumulation, which in turn increases the number of bits needed to represent a sample. In general, any decimation filtering will increase the number of bits needed to represent the signal. It is therefore necessary to provide a programmable divider circuit in the synthesiser in order to use this method.

Figure 8:
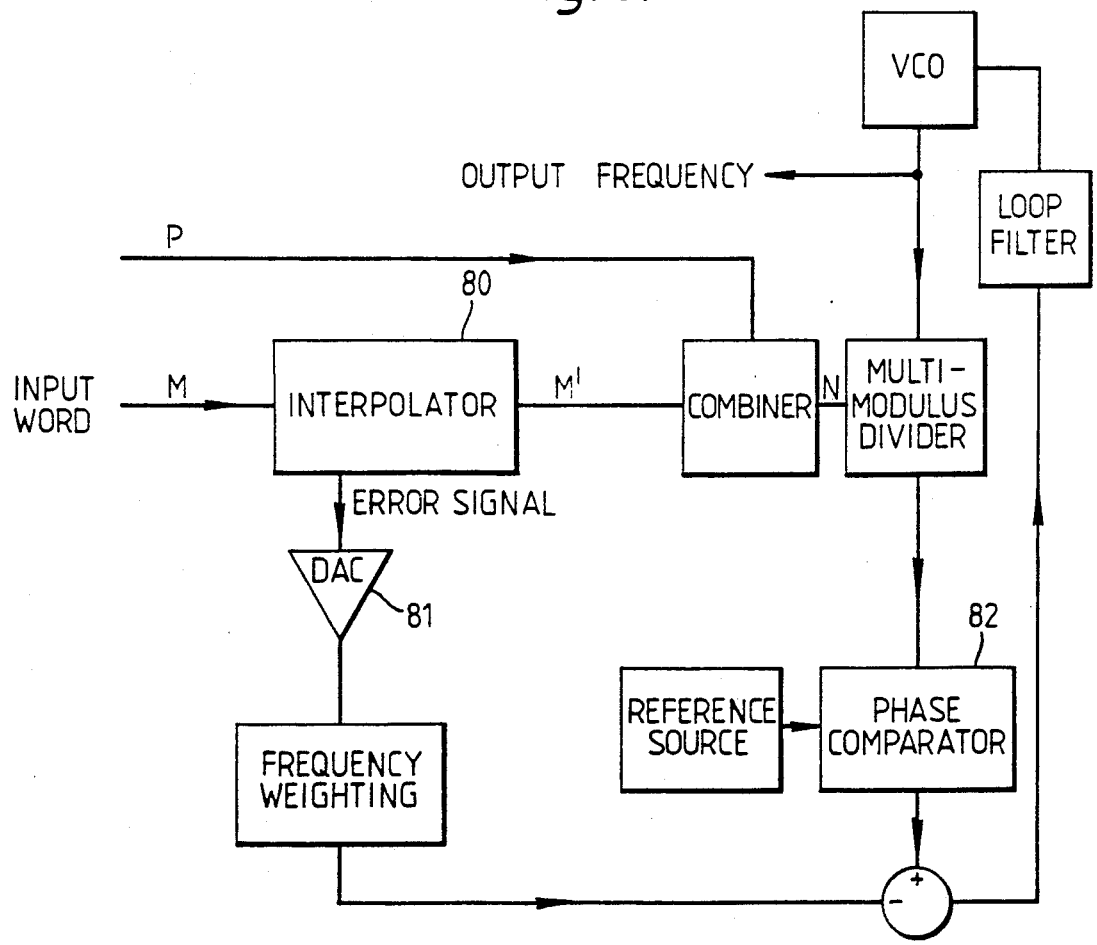
FIG. 8 illustrates an error compensating interpolating synthesiser.

If the in-band error signal is too large causing excess noise or spurii, it can be compensated for by extracting the error signal from the interpolator 80, converting it to analogue in DAC 81 and adding it to the output of the phase comparator 82 (see FIG. 8). Since the phase is the integral of frequency and the interpolator controls the frequency rather than the phase, the error signal may have to be passed through frequencyweighting network 83 prior to addition to the phase comparator output. This will depend from where in the interpolator the error signal is extracted.

Figure 9:
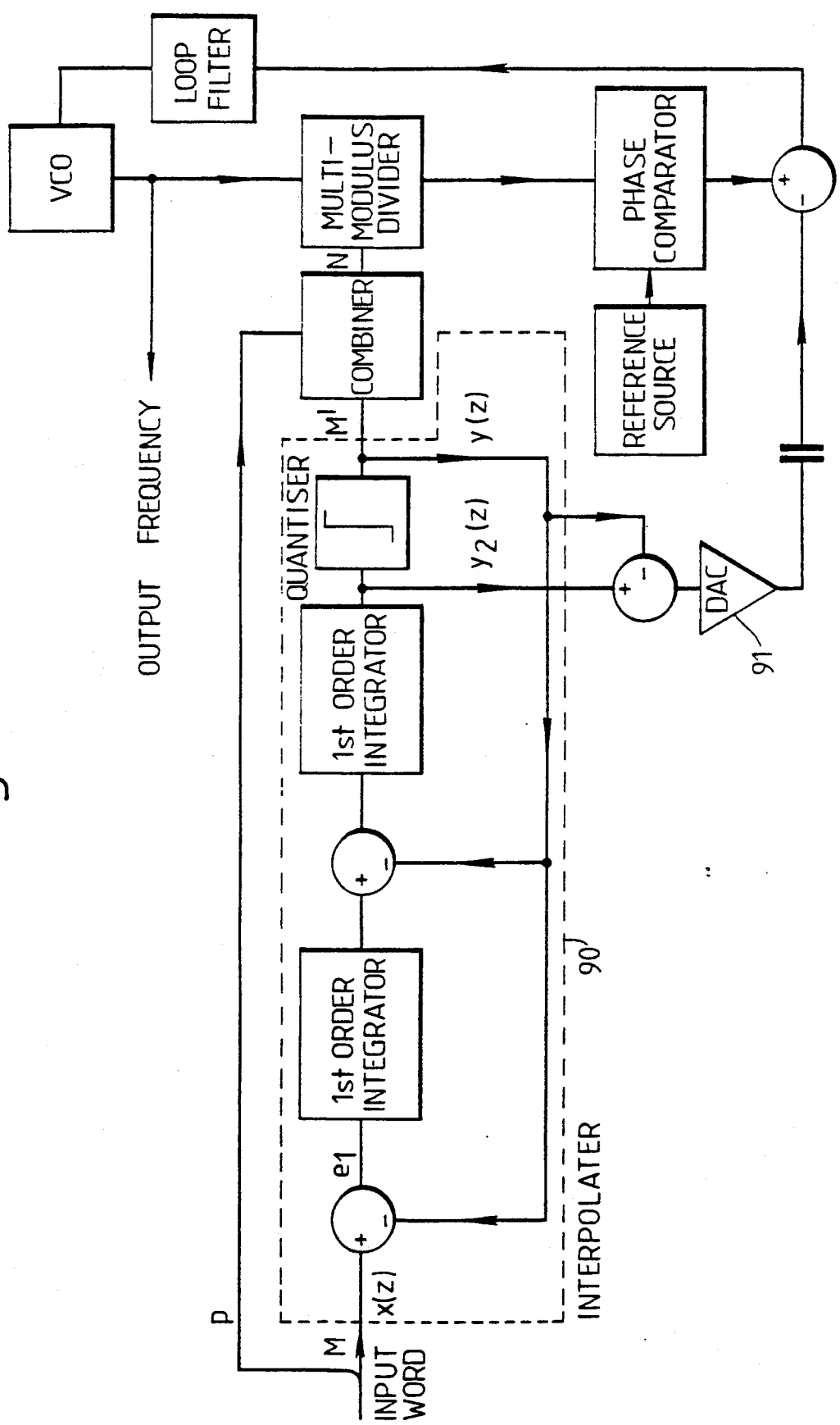
FIG. 9 illustrates an error compensating interpolating synthesiser with a second order, dual loop interpolator.

An example of such an arrangement for a second-order interpolator is shown in FIG. 9. The error between the output and the input is given by $$Y(z) - z^{-1}.X(z) = (1-z^{-1})^2 E(z) \qquad (8)$$

This corresponds to the error in frequency of the divider output. E(z) is the double integral of this error and corresponds to the integral of the phase error. The phase error from the interpolator can therefore be compensated for by converting E(Z) i.e. the quantisation error, Q, to the analogue domain via a DAC, differentiating it and adding it to the phase comparator output as shown in FIG. 9. The advantage of differentiating the DAC output is that it provides DC blocking and a low DC-offset DAC is not required.

The output from the second integrator of the modulator is $$Y_2(z) = z^{-1}.X(z) + (z^{-2} - 2z^{-1})E(z) \qquad (9)$$

Therefore:
$$Y_2(z) - Y(z) = -E(z) \qquad (10)$$

i.e. $- Q(t) = y_2(t) - y(t)$ in the time domain.

This relationship is the same as that derived for the higher order feed-forward coders described earlier and is easily implemented as shown in FIG. 9.

We claim:

1. A fractional-N frequency synthesiser including a voltage controlled oscillator (VCO);
   programmable divider means to which the VCO output is applied,
   a source of reference frequency,
   phase detector means to which the outputs of the divider means and the reference frequency are applied to detect phase differences therebetween,
   a feedback loop via which the output of the phase detector means is applied as a control signal to the VCO, and
   control means for controlling the division factor in the programmable divider means,
   said control means comprising logic means for converting an input number into an integer number and a fractional number, means for converting said fractional number into a digital data stream and means for combining said data stream and said integer number into a control signal for the divider means
   said means for converting said fractional number into a data stream comprising interpolation means implemented as a digital delta-sigma modulator.

2. A synthesiser according to claim 1 wherein said delta-sigma modulator is a second-order feedback modulator.

3. A synthesiser according to claim 2 including at least one additional first or higher order loop(s) to the modulator configured in a feed-forward arrangement.

4. A synthesiser according to claim 2 wherein the interpolator sampling frequency is a multiple of the synthesiser reference frequency, the synthesiser including means for sub-sampling the interpolator at the reference frequency.

5. A synthesiser according to claim 2 including means for extracting an error signal from the interpolator output, means for filtering the error signal, means for converting the filtered error signal to an analogue signal and means for adding the analogue signal to the output of the phase detector means.

6. A synthesiser according to claim 3 wherein the interpolator sampling frequency is a multiple of the synthesiser reference frequency, the synthesiser including means for sub-sampling the interpolator at the reference frequency.

7. A synthesiser according to claim 4 including means for extracting an error signal from the interpolator output, means for filtering the error signal, means for converting the filtered error signal to an analogue signal and means for adding the analogue signal to the output of the phase detector means.

8. A synthesiser according to claim 6 including means for extracting an error signal from the interpolator output, means for filtering the error signal, means for converting the filtered error signal to an analogue signal and means for adding the analogue signal to the output of the phase detector means.

* * * * *